United States Patent
Sugiura et al.

[11] Patent Number: 5,773,981
[45] Date of Patent: Jun. 30, 1998

[54] METHOD OF DETECTING LINEAR SOLENOID INTER-TERMINAL SHORT OF ELECTRONIC CONTROL TYPE AUTOMATIC TRANSMISSION

[75] Inventors: Masayuki Sugiura, Göteborg, Sweden; Shinichi Matsui, Nagoya, Japan; Tatsuyuki Yoneda; Kenji Suzuki, both of Okazaki, Japan

[73] Assignee: Aisin AW Co., Ltd., Japan

[21] Appl. No.: 708,194

[22] Filed: Sep. 6, 1996

[30] Foreign Application Priority Data

Sep. 8, 1995  [JP]  Japan ................................ 7-023157

[51] Int. Cl.$^6$ ................................ G01R 31/02
[52] U.S. Cl. ..................... 324/546; 324/415; 73/168
[58] Field of Search ............... 73/168; 324/546, 324/415, 418, 654

[56] References Cited

U.S. PATENT DOCUMENTS

| | | |
|---|---|---|
| 5,202,813 | 4/1993 | Uota et al. . |
| 5,251,091 | 10/1993 | Ito et al. . |
| 5,345,181 | 9/1994 | Mantani .......................... 324/546 |
| 5,492,009 | 2/1996 | Kempf ............................. 73/168 |
| 5,548,210 | 8/1996 | Dittrich ........................... 73/168 |
| 5,572,142 | 11/1996 | Muraki ............................ 324/546 |

FOREIGN PATENT DOCUMENTS

| | | |
|---|---|---|
| 404993 | 6/1989 | European Pat. Off. . |
| 7119816 | 5/1995 | Japan . |
| 2152305 | 7/1985 | United Kingdom . |

*Primary Examiner*—Ernest F. Karlsen
*Assistant Examiner*—Jose M. Solis
*Attorney, Agent, or Firm*—Lorusso & Loud

[57] ABSTRACT

A short between terminals of a linear solenoid controlled by an electronic control in an automatic transmission is detected by sensing when a PWM duty ratio set by a feedback control operating the linear solenoid is less than a reference duty ratio. The reference duty cycle is calculated to be between a range of expected normal duty ratios in the absence of the short and a range of expected short duty ratios in the presence of the short.

4 Claims, 5 Drawing Sheets

METHOD OF DETECTING LINEAR SOLENOID INTER-TERMINAL SHORT OF ELECTRONIC CONTROL TYPE AUTOMATIC TRANSMISSION

BACKGROUND OF THE INVENTION

1. Field of the Invention

The present invention relates to a method of detecting an electrical short between terminals of a linear solenoid in an automatic transmission operated by an electronic control.

2. Description of the Prior Art

One prior art method detects a short between terminals of a linear solenoid employed for feedback control of an automatic transmission by sampling deviations of detected actual values of inter-terminal current (or voltage) from a target value for a predetermined number of times. These sampled deviations are summed up, and the existence of an inter-terminal short is determined if the total exceeds a reference value.

When the battery voltage or the power supply of the linear solenoid fluctuates, the actual value may temporarily deviate from the target value to cause an incorrect determination of the inter-terminal short. In order to prevent this incorrect determination, the aforementioned prior art short detection method is executed only when the fluctuation of the battery voltage is low (as disclosed in Japanese patent Laid-Open No. 119816/1995, for example).

However because this detection method is executed only during the absence of significant battery voltage fluctuations, the prior art method has the possibility that the determination of an inter-terminal short detection may be significantly delayed.

SUMMARY OF THE INVENTION

The present invention contemplates to solve this problem and has an object to provide such a method of detecting an inter-terminal short in a linear solenoid operated by an electronic control in an automatic transmission even during significant battery voltage fluctuations.

In order to achieve the above-specified object, the present invention, provides a method of detecting a short between terminals of a linear solenoid operated by an electronic control in an automatic transmission including energizing the linear solenoid by pulse width modulation (PWM) with a duty ratio set by a feedback control to produce a target value of electrical current wherein a reference duty ratio is set based upon a short duty ratio expected to produce the target value when the linear solenoid is shorted. This reference duty ratio is compared with the duty ratio set by the feedback control, and if the duty ratio set by the feed back control is less than the reference duty ratio, it is determined that a short exists between the terminals of the linear solenoid.

The resistance of the linear solenoid energizing circuit with the feedback control excluding the resistance of the solenoid is lower than the resistance of the solenoid. Hence, the variable range of the normal (non-shorted linear solenoid) duty ratio to achieve the predetermined target current value during voltage fluctuation (the predetermined or warranted operating voltage range of the transmission control circuit, e.g. 9 to 16 V) does not overlap the variable range of the short (linear solenoid with shorted terminals) duty ratio to achieve the predetermined target current value during voltage fluctuation.

Without any inter-terminal short, therefore, the duty ratio set by the feedback control will not occur within the variable range of duty ratios set by the feedback control in the presence of an inter-terminal short and significant voltage fluctuations.

Thus, the reference duty ratio is set based upon the expected short duty ratio required to produce the target value, so that the inter-terminal short can be detected even with voltage fluctuations by sensing when the duty ratio set by the feedback control becomes smaller than the reference duty ratio.

In a further method of detecting a short between terminals of a linear solenoid an automatic transmission operated by an electronic control, the reference duty ratio is set higher than the expected short duty ratio to be achieved by the feedback control at the target current and at a minimum voltage during battery voltage fluctuation with a circuit resistance excluding the resistance of the linear solenoid, and lower than the expected normal duty ratio to be achieved by the feedback control at the target current and at a maximum voltage during battery voltage fluctuation with the circuit resistance including the resistance of the linear solenoid. As a result, the inter-terminal short can be reliably determined.

In a still further method of detecting a short between terminals of a linear solenoid of an automatic transmission, the inter-terminal short is determined when the duty ratio set by the feedback control continues to be less than the reference duty ratio for a predetermined time period or longer. As a result, it is possible to prevent the faulty detection which might otherwise accompany a delay in the feedback control or the like.

BRIEF DESCRIPTION OF THE DRAWINGS

Other objects, features and advantages of the present invention will become apparent from the following description with reference to the accompanying drawings, in which.

DESCRIPTION OF THE PREFERRED EMBODIMENTS

Figure 1:
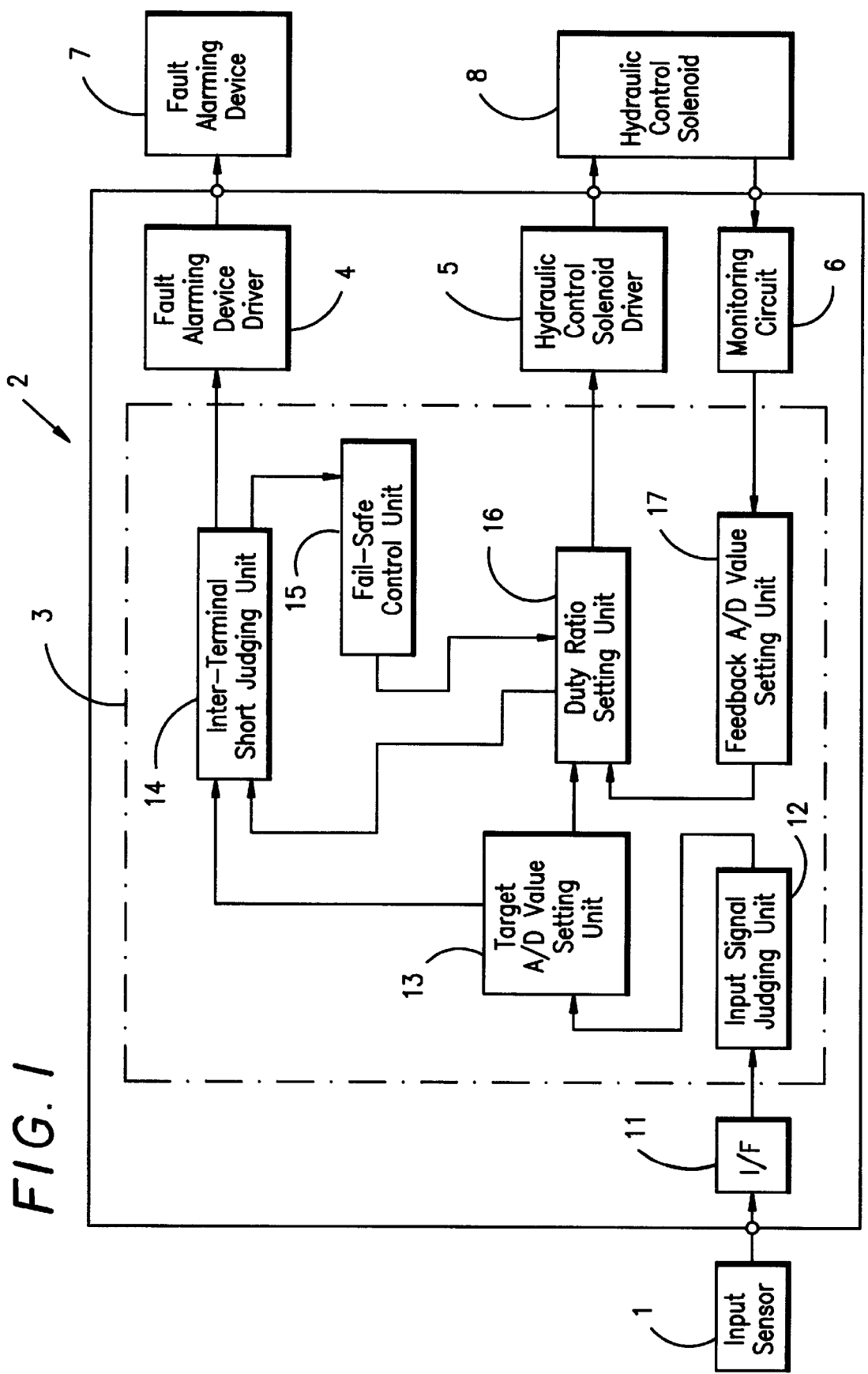
FIG. 1 is a block diagram of an electronic control for an automatic transmission in accordance with one embodiment of the present invention.

In an electronic control as shown in FIG. 1 in accordance with one embodiment of the present invention, a reference numeral 1 designates an input sensor such as a throttle sensor and/or a vehicle speed sensor; a numeral 2 designates an electronic control unit; and a numeral 3 designates a microcomputer ($\mu$p). This electronic control unit 2 includes an interface circuit 11, an input signal judging unit 12, a target A/D value setting unit 13, an inter-terminal short judging or determining unit 14, a fail-safe control unit 15, a duty ratio setting unit 16, a feedback A/D value setting unit 17, a fault alarm driver 4, a hydraulic control solenoid driver 5 and a monitoring circuit 6. On the other hand, a numeral 7 designates a fault alarm and a numeral 8 designates a hydraulic control solenoid, both individually connected with the electronic control unit 2.

Figure 2:
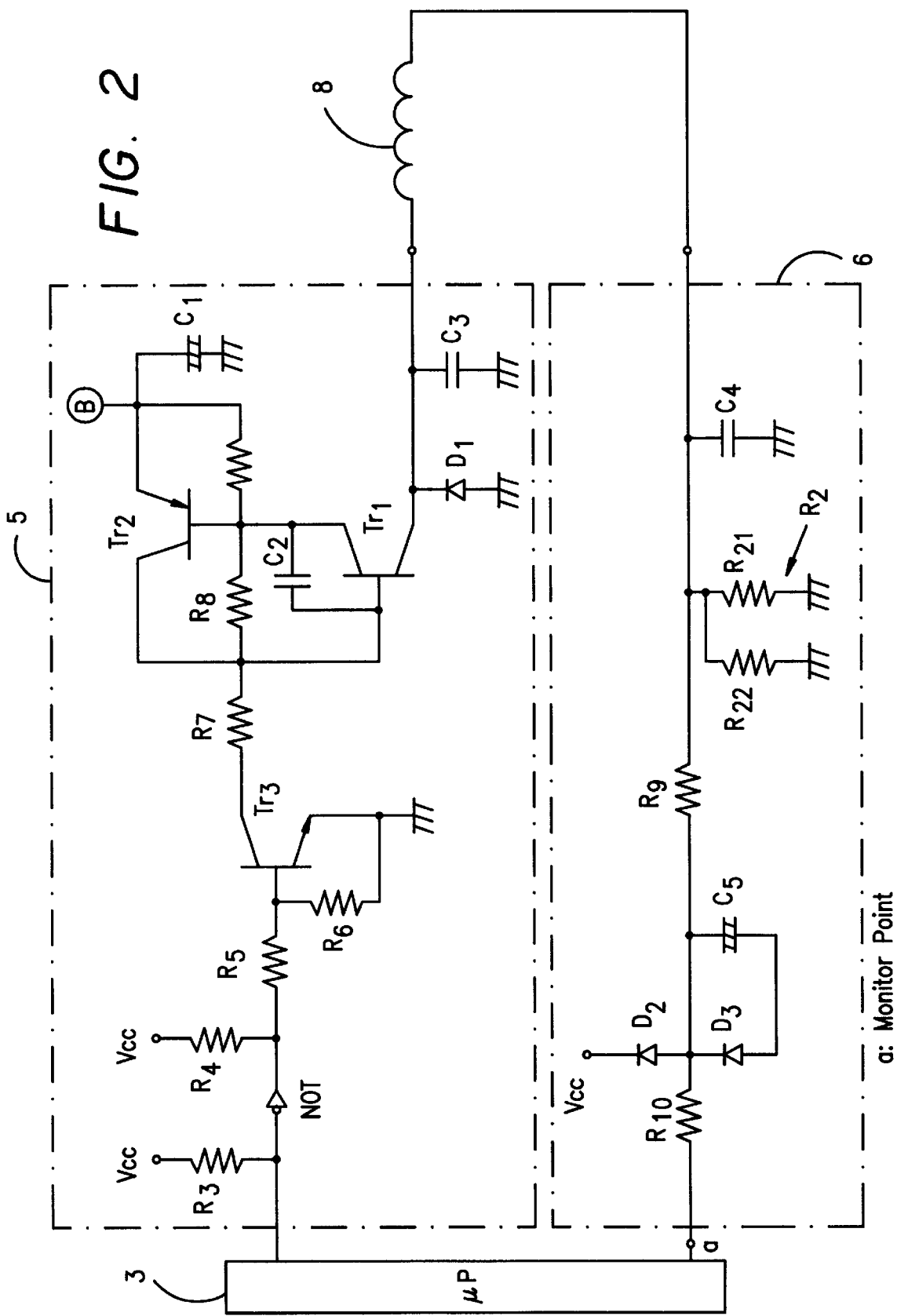
FIG. 2 is a circuit diagram of an interface for a linear solenoid of the electronic control if FIG. 1.

As shown in FIG. 2, the driver 5 of the hydraulic control solenoid 8 includes a battery voltage B; a switching PNP transistor $Tr_1$; an overcurrent protecting PNP transistor $Tr_2$; an NPN transistor $Tr_3$ for receiving a signal from the microcomputer 3; capacitors $C_1$ to $C_3$; resistors $R_1$ and $R_3$ to $R_8$; a flywheel diode $D_1$; and an inverter or logical NOT circuit NOT.

The monitoring circuit 6 includes resistances $R_2$ (e.g., parallel resistors $R_{21}$ and $R_{22}$), $R_9$ and $R_{10}$; capacitors $C_4$ and $C_5$; and diodes $D_2$ and $D_3$.

In operation of the circuit of FIG. 2, a command signal at a Low level output from the microcomputer 3 is inverted to a High level signal by the negative logic NOT circuit to raise the base potential of the NPN transistor $Tr_3$ so that the transistor $Tr_3$ is turned ON. Then, the base potential of the switching PNP transistor $Tr_1$ is lowered so that the transistor $Tr_1$ is turned ON to energize the hydraulic control solenoid 8 with the battery voltage B through the resistor $R_1$. This energization is monitored by the resistance $R_2$ to produce information read by the microcomputer 3.

On the other hand, when a command signal at the High level is output from the microcomputer 3, it is inverted to the Low level signal by the negative logic NOT circuit to lower the base potential of the NPN transistor $Tr_3$ so that the transistor $Tr_3$ is turned OFF. Then, the base potential of the switching PNP transistor $Tr_1$ is raised so that the transistor $Tr_1$ is turned OFF to energize the hydraulic control solenoid 8. This deenergization is monitored by the resistance $R_2$ and read by the microcomputer 3.

In the control of the hydraulic control solenoid 8 with reference to FIG. 1, a signal such as a throttle opening signal or a vehicle speed signal, as detected by the input sensor 1, is input through the interface circuit 11 to the input signal judging unit 12 so that the throttle opening or the vehicle speed is judged and output to the target A/D value setting unit 13. On the basis of the input throttle opening or vehicle speed, the target A/D value setting unit 13 sets a value corresponding to the desired oil pressure level to be output from the linear solenoid valve 23, shown in FIG. 5. The target A/D value is an electrical current value, but may alternatively be some other electrical target value, such as voltage between the terminals of the hydraulic control solenoid 8, corresponding to the desired oil pressure value.

The duty ratio setting unit 16 sets and adjusts a duty ratio W based upon the difference between the target A/D value, as set in the target A/D value setting unit 13, and the feedback A/D value from a feedback A/D value setting unit 17. An output signal corresponding to the set duty ratio W is applied by the duty ratio setting unit to the hydraulic control solenoid driver 5. This hydraulic control solenoid driver 5 drives the hydraulic control solenoid 8 in accordance with the signal coming from the duty ratio setting unit 16.

The monitoring circuit 6 detects the voltage across the current detecting resistance $R_2$; this voltage corresponds to the current passing through the terminals of the hydraulic control solenoid 8. The detected voltage value is converted by the feedback A/D value setting unit 17 into the corresponding electrical current value passing through the terminals of the hydraulic control solenoid 8 and is output to the duty ratio setting unit 16.

Thus, the feedback control is operated so that the current passing through the terminals of the hydraulic control solenoid 8 equals the target A/D value as set in the target A/D value setting unit 13.

The inter-terminal short judging unit 14 determines the existence of an inter-terminal short from the target A/D value as set by the target A/D value setting unit and from the set duty ratio as set by the duty ratio setting unit 16. If an inter-terminal short is determined, the inter-terminal short judging unit 14 outputs a signal to the fail-safe control unit 15 which in turn controls the duty ratio setting unit 16 to stop the output to the hydraulic control solenoid driver 5 and the hydraulic control solenoid 8. The inter-terminal short judging unit 14 also outputs a signal to the fault alarm device driver 4 to operate the fault alarm device 7 to thereby inform the operator of the fault.

The detection of the short between the terminals of the control solenoid is described with reference to FIGS. 2 and 3. In FIG. 2, reference letter B designates the battery voltage which can fluctuate in a manufacturer's range of 9 to 16 V. Characters $R_1$ and $R_2$ designate the resistors which are connected in series with the hydraulic control solenoid 8; the resistor $R_1$ is an overcurrent protection resistor of 0.22 Ω ± 5% whereas the resistor $R_2$ is a resistor for detecting the current through the control solenoid for the current feedback control and has a resistance of 0.9 Ω±1% (or two parallel resistors of 1.8 Ω).

Additionally, the resistance of the hydraulic control solenoid 8 itself varies in a range from 2 to 5Ω considering the variation in manufacture and the variation caused by changes in environmental temperature. The current range for operation of the hydraulic control solenoid 8 is from 0.3 to 1 A. The control unit has the ability to adjust the current to a constant considering all the aforementioned variations. This current is adjusted by PWM (pulse width modulation) at 300 Hz by the microcomputer 3. The duty range of the PWM for satisfying the above-specified conditions have the minimum and maximum, as illustrated in FIG. 3. That is, the duty range of the PWM in a normal state has a minimum $D_{min}$ and a maximum $D_{max}$:

$$D_{min} = \left[ \frac{A \times (2 + 0.22 \times 0.95 + 0.9 \times 0.99)}{16} \right] \times 100 = 19.4 \times A \%;$$

and $$D_{max} = \left[ \frac{A \times (5 + 0.22 \times 1.05 + 0.9 \times 1.01)}{9} \right] \times 100 = 68.2 \times A \%,$$

if:

Battery Voltage: 9 to 16 V;

Overcurrent protecting Resistor R: 0.22 ± 5%;

Monitor Current Detecting Resistor $R_2$: 0.9 ± 1%;

Solenoid Resistance: 2 to 5 ±; and

Current Value: A amperes.

Thus, the duty ratio in a normal state ranges from 19.4×A% to 68.2×A%.

On the other hand when there is a short between the control solenoid terminals, the duty range of the PWM has a minimum $D_{min\text{-}s}$ and a maximum $D_{max\text{-}s}$:

$$D_{min\text{-}S} = \left[ \frac{A \times (0.22 \times 0.95 + 0.9 \times 0.99)}{16} \right] \times 100 = 6.9 \times A \%;$$

and

-continued $$D_{max-S} = \left[ \frac{A \times (0.22 \times 1.05 + 0.9 \times 1.01)}{9} \right] \times 100 = 12.7 \times A \%.$$

Thus when the terminals of the control solenoid are shorted, the duty ratio ranges from 6.9×A% to 12.7×A%.

In the present embodiment, therefore, the reference duty ratio is set between the range (6.9×A% to 12.7×A%) of the expected duty ratio in the shorted state and the range (19.4×A% to 68.2×A%) of the expected duty ratio in the normal state.

Figure 5:
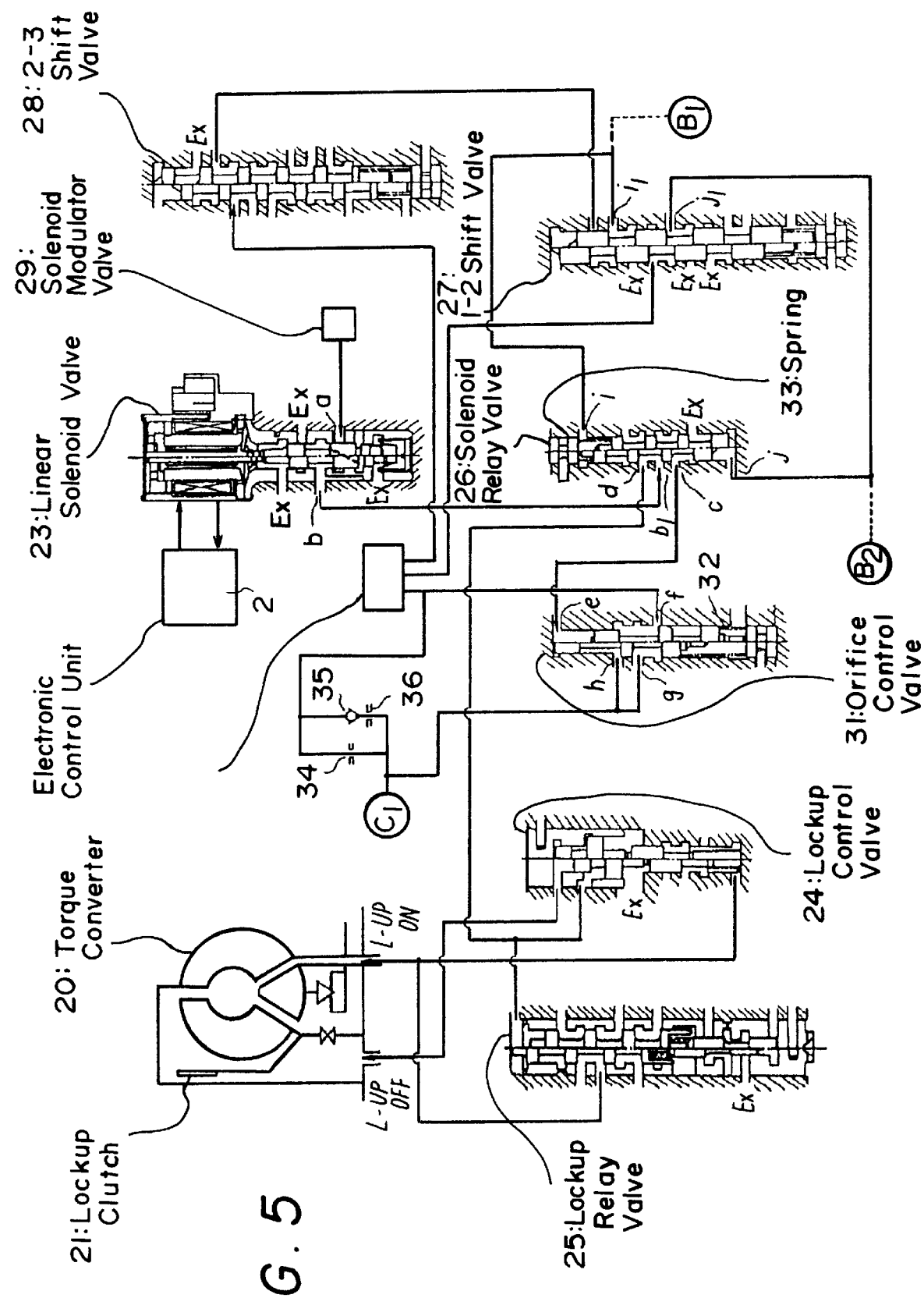
FIG. 5 is a hydraulic control diagram showing an example of applying the present invention to an automatic transmission.

The hydraulic control solenoid 8 controls the output oil pressure of a linear solenoid valve 23 of FIG. 5 to 0.5 to 4.5 Kg/cm² between the current value of 1 to 0.3 A, as output from the electronic control unit 2, on the basis of the information of the input sensor 1 such as throttle opening and/or the vehicle speed, thereby to control an orifice control valve 31, a lockup control valve 24 and a lockup relay valve 25.

The driver 5 and the monitoring circuit 6 for the hydraulic control solenoid 8 are shown in FIG. 2 and constitute a current feedback control so as to correct the output oil pressure (current through the control solenoid) during variations or fluctuations of the battery voltage and the resistance of the solenoid. Hence, both the + and − terminals of the hydraulic control solenoid 8 are connected with the electronic control unit 2.

If these + and − terminals of the hydraulic control solenoid 8 are shorted, the current flow through the solenoid 8 becomes zero so that the output oil pressure takes a value of 5 Kg/cm2 which exceeds the normal maximum pressure. This makes it necessary to reliably detect the inter-terminal short fault to control the fail-safe and provide a warning of the fault.

When the + and − terminals of the hydraulic control solenoid (or linear solenoid) 8 are shorted, the resistance of the feedback control system or circuit (excluding the resistance of the solenoid) is lower than the resistance of the solenoid, as described above. Hence, there is no overlap (as illustrated in FIG. 3) of the variable range of the normal duty ratio for achieving a predetermined target current value in the absence of an inter-terminal short with the variable range of the short duty ratio for the same predetermined target current value when the terminals are shorted. These variable ranges remain non-overlapping even with maximum voltage fluctuation within the warranty voltage range (9 to 16 V) of the control system of the automatic transmission.

Figure 3:
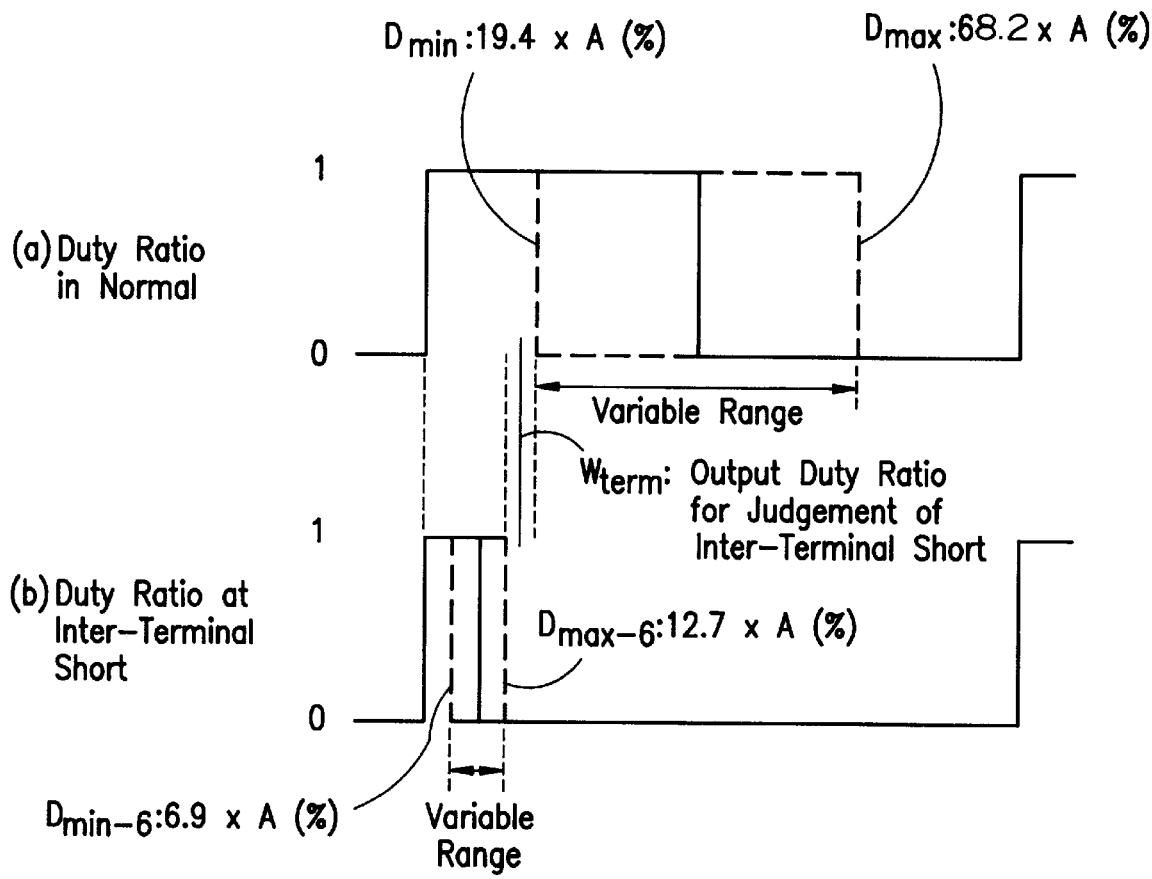
FIG. 3 is a diagram of waveforms monitored in FIG. 1 for setting a reference duty ratio used to detect an inter-terminal short in accordance with the one embodiment of the present invention.

The range of normal duty ratios (FIG. 3, (a)) set by the feedback control will always be spaced by some range of duty ratios (as illustrated between (a) and (b) in FIG. 3) above the range of short duty ratios (FIG. 3, (b)) set by the feedback control in the presence of a short between the control solenoid terminals even if maximum voltage fluctuation occurs.

Noting this, the reference duty ratio is set to a value between the range of normal duty ratios and the range of short duty ratios based upon the target value, so that the inter-terminal short can be determined or detected by sensing when the duty ratio set by the feedback control becomes smaller than the reference duty ratio.

Figure 4:
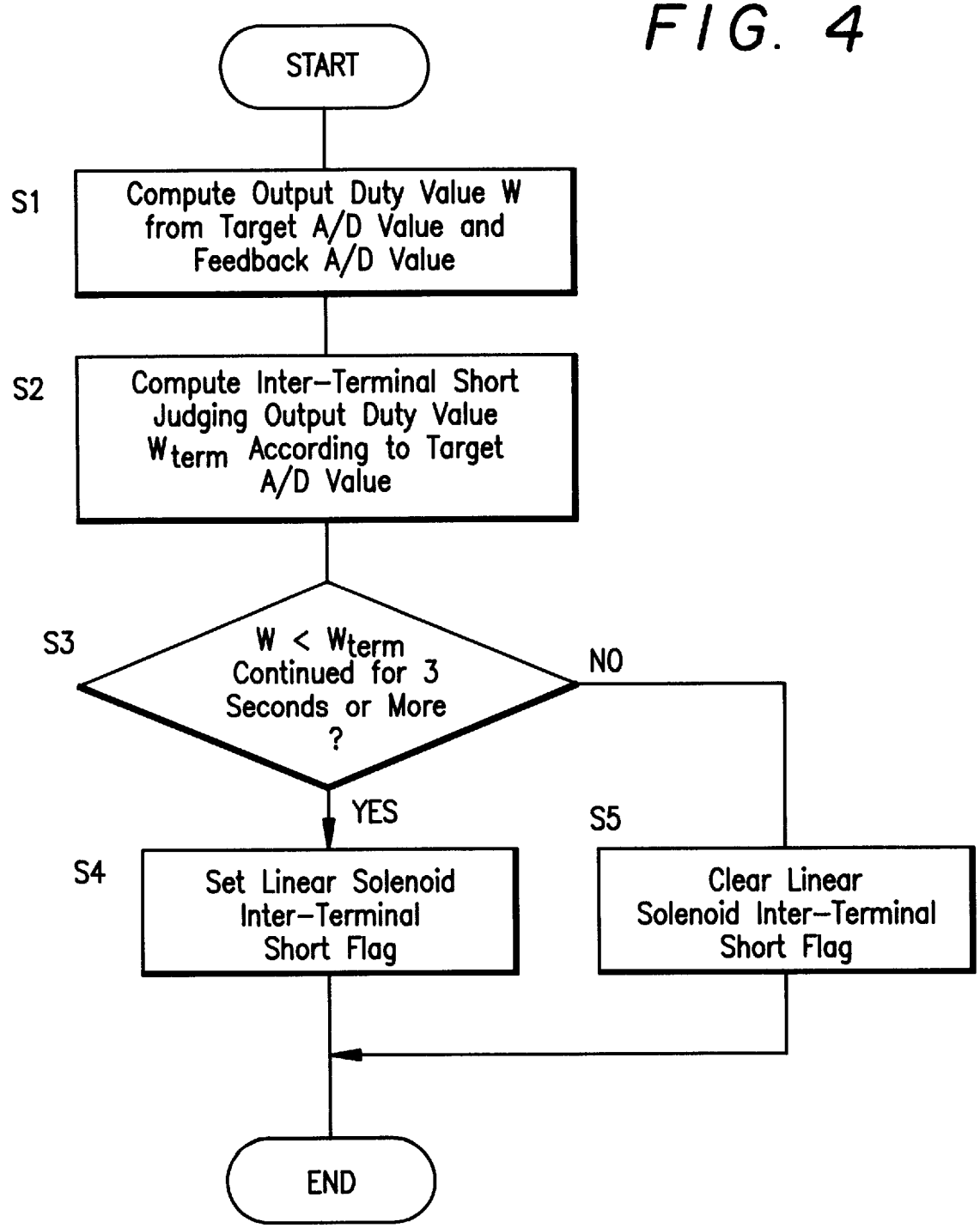
FIG. 4 is flow chart of a procedure for detecting a fault at an inter-terminal short time of a linear solenoid in accordance with the one embodiment of the present invention.

With reference to FIG. 4, a fault detecting procedure for detecting an inter-terminal short of the linear solenoid, first of all, computes the output duty value (or set duty value) at Step S1 from the target current value (called the "target A/D value") and the feedback current value (called the "feedback A/D value"). This step is executed in the duty ratio setting unit 16 which in response to a difference between the target A/D value and the feedback A/D value produces an appropriate change in the output duty value to reduce such difference.

Next, the inter-terminal short reference duty value $W_{term}$ according to the target A/D value is computed (at Step S2). This step is executed in the inter-terminal short judging unit 14. The reference duty value $W_{term}$ is set to a value between the range of duty values in the normal state and the range of duty values in shorted state, as described above. Since the ranges of duty values in the normal and shorted states are dependent upon the target A/D value, this reference duty value $W_{term}$ is also based upon the target A/D value.

Next, it is determined at Step S3 whether or not the output duty value W (duty value set by the feedback control) is smaller than the reference duty value $W_{term}$ for a period of three seconds or more. This step is also executed in the inter-terminal short judging unit 14.

If the answer of Step S3 is YES, a linear solenoid inter-terminal short flag is set at Step S4. If the answer is NO, on the other hand, the linear solenoid inter-terminal short flag is cleared at Step S5. These steps are also executed in the inter-terminal short judging unit 14.

Thus, the inter-terminal short is determined or detected by performance of the procedure of Steps S1 to S5 in the inter-terminal short judging unit 14.

A concrete hydraulic control system for an automatic transmission, as shown in FIG. 5, finely adjusts the oil pressure by the linear solenoid valve 23, and feeds the adjusted oil pressure to an orifice control valve 31 for adjusting the valve position of the orifice control valve 31. Specifically, a solenoid modulator valve 29 receives the oil pressure regulated by a primary regulator valve (not-shown) and modulates it for the individual solenoids. The oil pressure, as modulated by the solenoid modulator valve 29, is fed to a port a of the linear solenoid valve 23. This linear solenoid valve 23 is linearly controlled by a signal, as fed from the linear solenoid control unit 2 (FIG. 1), to adjust the oil pressure fed to the port a and feed it to a port b.

Subsequently, the oil pressure from the port b is fed to a port $b_1$ of a solenoid relay valve 26. This solenoid relay valve 26 is enabled to take two positions shown by righthand half and lefthand half positions. In the righthand half position, the aforementioned port $b_1$ is connected to a port c to feed the oil pressure to a port e at one end of the orifice control valve 31. In the lefthand half position, on the other hand, the port $b_1$ is connected to a port d so that the oil pressure adjusted finely by the solenoid relay valve 26 is fed to a lockup operation unit and used to turn ON/OFF the lockup.

The aforementioned orifice control valve 31 is adjusted in its valve position by the balance between the oil pressure, as finely adjusted by the linear solenoid valve 23 and fed to the port e, and the biasing force of a spring 32. Moreover, the oil pressure from the manual valve 22 is fed via a port f to the orifice control valve 31 and sent in the lefthand half position via a port g and in the righthand half position via ports g and h to a forward clutch C1.

As a result, when the valve member of the orifice control valve 31 gradually moves down as it is fed with the oil pressure from the aforementioned linear solenoid valve 23, a small quantity of oil is sent at first via the port g and a larger quantity of oil is sent later via the ports g and h to the forward clutch C1 so that shifting shock is reduced.

Additionally, the oil from the manual valve 22 is fed not only through the orifice control valve 31 but also a throttle 34 and a throttle 36 having a check valve 35 to the forward clutch C1. By the action of the throttle 36 having the check valve 35, the oil flow rate or drain from the forward clutch $C_1$ can be increased compared to the oil flow fed to the clutch.

The solenoid relay valve 26 distributes the oil pressure from the linear solenoid valve 23 either for adjusting the valve position of the orifice control valve 31 or for controlling the lockup operation unit by taking two positions, i.e., the righthand half and lefthand half positions, respectively. For the lockup operation, the oil pressure for applying a second coast brake $B_1$ is fed to a port i at one end of the solenoid relay valve 26 from a port $i_1$ of a 1-2 shift valve 27, and an oil pressure for applying a second brake $B_2$ is fed to a port j at the other end of the solenoid relay valve 26 from a port $j_1$ of the 1-2 shift valve 27. On the valve end face at the side of the aforementioned port i, moreover, there is arranged a spring 33 for urging the valve downward.

Here at the 1st speed of D, 2nd and L ranges, neither the second coast brake $B_1$ nor the second brake $B_2$ is applied to feed no oil pressure to the ports i and j so that the aforementioned solenoid relay valve 26 is held in the righthand half position exclusively by the urging force of the spring 33.

Next at the 2nd or higher speed of the D, 2nd and L ranges, the second brake $B_2$ is applied to feed the oil pressure to the port j. At the 2nd speed of the 2nd and L ranges, not only the second brake $B_2$ but also the second coast brake $B_1$ is applied to feed the oil pressure to the port i, too. Incidentally, when both the ports i and j are fed with the oil pressures, these oil pressures are fed from a manual valve 22 through the 1-2 shift valve 27 or a 2-3 shift valve 28. These pressures are at the same level to push the two end faces of the solenoid relay valve 26 by the equal forces. As a result, the solenoid relay valve 26 is caused to take the righthand half position exclusively by the urging force of the spring 33.

Specifically, when a shift is made from each of the N, R and p ranges to the 1st speed of the D, 2nd and L ranges, the solenoid relay valve 26 always takes the righthand half position so that it can feed the oil pressure of the linear solenoid valve 23 to the orifice control valve 31 to reduce the shift shock.

When a 2nd or higher speed of the D, 2nd and L ranges is taken, on the other hand, the lockup mechanism is operated. As a result, the solenoid relay valve 26 takes the lefthand half position to feed the oil pressure of the linear solenoid valve 23 to the lockup control valve 24 and the lockup relay valve 25. Incidentally, the lockup has to be released for starting the 2nd speed of the 2nd range. Since, however, the solenoid relay valve 26 is caused at the 2nd speed of the 2nd and L ranges to take the righthand half position exclusively by the urging force of the spring 33, as described above, the oil pressure of the linear solenoid valve 23 is fed to neither the lockup control valve 24 nor the lockup relay valve 25.

In the hydraulic control system thus constructed according to the present invention, the solenoid of the aforementioned linear solenoid valve 23 is driven by connecting the electronic control unit 2 with it. As a result, a short fault between the terminals of the solenoid of the linear solenoid valve 23 can be reliably detected independently of the voltage fluctuation of the battery. Incidentally, in FIG. 5, reference numeral 20 designates a torque converter, and numeral 21 designates a lockup clutch.

Since the occurrence of the short fault is stored in the memory of the electronic control unit 2, moreover, the faulty portion can be promptly located by reading the memory by a diagnosis tester or the like, to improve the serviceability.

The present invention is not limited to the foregoing embodiment which can be modified without departing from the gist of the invention, and such modifications are not excluded from the scope of the present invention.

What is claimed is:

1. A method of detecting a short between terminals of a linear solenoid of an automatic transmission operated by an electronic control wherein the linear solenoid is driven by pulse width modulation at a duty ratio set by a feedback control to maintain electrical current through the terminals of the linear solenoid at a target value, comprising:

setting a reference duty ratio based upon a short duty ratio expected to produce the target value of current through the linear solenoid when the linear solenoid is shorted;

comparing the reference duty ratio with the duty ratio set by the feedback control; and determining the existence of a short between the terminals of the linear solenoid when said comparing indicates that the duty ratio set by the feedback control is smaller than the reference duty ratio.

2. A method of detecting a short between terminals of a linear solenoid of an automatic transmission operated by an electronic control as set forth in claim 1, wherein the reference duty ratio is set (a) higher than a short duty ratio expected from the feedback control at the target value of electrical current produced by a minimum voltage during battery voltage fluctuation and with a circuit resistance excluding the resistance of the linear solenoid and (b) lower than a normal duty ratio expected from the feedback control at the target value of electrical current produced by a maximum voltage during battery voltage fluctuation and with a circuit resistance including the resistance of the linear solenoid.

3. A method of detecting a short between terminals of a linear solenoid of an automatic transmission operated by an electronic control as set forth in claim 1, wherein said determining of the existence of a short includes determining that the duty ratio set by the feedback control is lower than the reference duty ratio for a predetermined time period or longer.

4. A method of detecting a short between terminals of a linear solenoid as set forth in claim 1, wherein the reference duty ratio is set between a range of normal duty ratios and a range of short duty ratios, said range of normal duty ratios being a range expected for operation in a manufacturer's voltage range in the absence of a short between the linear solenoid terminals, and said range of short duty ratios being a range expected for operation in the manufacturer's voltage range in the presence of a short between the linear solenoid terminals.

* * * * *

UNITED STATES PATENT AND TRADEMARK OFFICE
CERTIFICATE OF CORRECTION

PATENT NO.  : 5,773,981
DATED       : June 30, 1998
INVENTOR(S) : SUGIURA et al

It is certified that error appears in the above-indentified patent and that said Letters Patent is hereby corrected as shown below:

On the title page, item [30], Under the Heading, "Foreign Application Priority Data", "Japan 7-023157" should read "Japan 7-0231257".

Col. 2, line 61, "$\mu p$" should read --$\mu P$--.

Col. 4, line 51, "R:0.22 ± 5%" should read --$R_1$:0.22$\Omega$ ± 5%--;
        line 52, "$R_2$:0.9 ± 1%" should read --$R_2$:0.9$\Omega$ ± 1%--; and
        line 53, "2 to 5 ±" should read --2 to 5$\Omega$--.

Col. 7, line 33, "p" should read --P--.

Signed and Sealed this

Eleventh Day of May, 1999

Attest:

Attesting Officer

Q. TODD DICKINSON

Acting Commissioner of Patents and Trademarks